United States Patent
Wang et al.

(10) Patent No.: US 6,884,329 B2
(45) Date of Patent: *Apr. 26, 2005

(54) DIFFUSION ENHANCED ION PLATING FOR COPPER FILL

(75) Inventors: Wei D. Wang, San Jose, CA (US); Anantha K. Subramani, San Jose, CA (US); Jianming Fu, Palo Alto, CA (US); Praburam Gopalraja, San Jose, CA (US); Jick M. Yu, San Jose, CA (US); Fusen Chen, Saratoga, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/340,564

(22) Filed: Jan. 10, 2003

(65) Prior Publication Data

US 2004/0134768 A1 Jul. 15, 2004

(51) Int. Cl.⁷ .............................................. C23C 14/34
(52) U.S. Cl. ............................. 204/192.3; 204/192.15
(58) Field of Search ........................ 204/192.15, 192.3; 427/252, 404

(56) References Cited

U.S. PATENT DOCUMENTS

| | | | | |
|---|---|---|---|---|
| 5,171,412 A | * | 12/1992 | Talieh et al. ........... | 204/192.15 |
| 6,179,973 B1 | | 1/2001 | Lai et al. ............... | 204/192.12 |
| 6,184,137 B1 | | 2/2001 | Ding et al. ............. | 438/687 |
| 6,197,167 B1 | * | 3/2001 | Tanaka .................. | 204/192.15 |
| 6,274,008 B1 | * | 8/2001 | Gopalraja et al. ..... | 204/192.17 |
| 6,605,197 B1 | * | 8/2003 | Ding et al. ............ | 204/192.15 |
| 6,709,970 B1 | * | 3/2004 | Park et al. ............. | 438/620 |

FOREIGN PATENT DOCUMENTS

EP    0 878 843    11/1998    ......... H01L/21/768

OTHER PUBLICATIONS

Miyake et al., "Effects of atomic hydrogen on Cu reflow process," *Stress Induced Phenomena in Metallization*, Fourth International Workshop, Tokyo, Japan, Jun. 1997, AIP Conference Proceedings 418, 1998, pp. 419–423.

* cited by examiner

*Primary Examiner*—Steven Versteeg
(74) *Attorney, Agent, or Firm*—Charles S. Guenzer

(57) ABSTRACT

A method of filling copper into a high-aspect ratio via by a plasma sputter process and allowing the elimination of electrochemical plating. In one aspect of the invention, the sputtering is divided into a first step performed at a low temperature of no more than 100° C. and with at least portions of high wafer bias, thereby filling a lower half of the hole, and a second step performed at a higher temperature, e.g., at least 200° C. and with at least portions of low wafer bias to complete the hole filling. In another aspect of the invention, diffusion promoting gas such as hydrogen is added to the copper sputter plasma. In still another aspect, copper sputtering, even in the final fill phase, is performed through multiple cycles of low-level and high-level pedestal bias to deposit copper on exposed corners and to sputter from the corners.

34 Claims, 5 Drawing Sheets

DIFFUSION ENHANCED ION PLATING FOR COPPER FILL

BACKGROUND OF THE INVENTION

1. Field of the Invention

The invention relates generally to sputtering of materials in the fabrication of semiconductor integrated circuits. In particular, the invention relates to ionized copper sputtering.

2. Background Art

Copper is rapidly replacing aluminum as the preferred metallization in advanced semiconductor integrated circuits. Metallization is used to form electrical interconnects extending horizontally in usually multiple wiring levels and extending vertically between wiring levels. Such vertical interconnects are usually called vias. Similar vertical connections to an underlying silicon layer are usually called contacts and require additional barriers and contact layers, but for purposes of this invention, they may be considered as vias. Copper is advantageous for metallization because, among other reasons, it has a lower electrical resistivity and is less subject to electromigration than aluminum. It is understood that the copper used for metallization need not be pure but may be advantageously doped with alloying elements such as magnesium and aluminum or other intentional or unintentional dopants to less than 10 wt %. Copper presents challenges as well as the stated advantages over aluminum.

Aluminum etching techniques are well developed to define the horizontal wiring and to restrict the aluminum to the via area, but copper has proven to be difficult if not impossible to etch in a commercial environment. Instead, damascene processes have been developed. As illustrated in the cross-sectional view of FIG. 1, a lower-level dielectric layer 10 is typically formed of a material based on an oxide of silicon, hence its common name of oxide layer. Conductive features 12, 13, such as copper features, in a surface of the lower-level dielectric layer 10. An inter-level dielectric layer 14 is deposited as a planar layer over the lower-level dielectric layer 10 and its conductive features 12, 13. In the case of single damascene, a via hole 16 is etched through the inter-level dielectric layer 14 over the conductive feature 12 to be electrically contacted. In the case of dual damascene, a more complex hole is etched including a via hole 18 in the lower portion of inter-level dielectric layer 14 and a wider trench 20 in its upper part connected to the via hole 18. While the via holes 16, 18 typically have a circular shape of minimum width, approximately 0.13 $\mu$m in current advanced technology, and provide the vertical interconnects, the trench 20 has a larger rectangular shape that may extend a significant distance perpendicularly to the plane of illustration to provide a horizontal interconnect perhaps contacting multiple conductive features in the lower-level dielectric layer 14 as well as providing conductive features or pads to a yet higher level of wiring. The etching of the complex dual-damascene structure of the trench 20 and connected via 18 may be done in a number of well known ways, typically involving an unillustrated etch stop layer, for example, of silicon nitride formed midway in the inter-level dielectric layer 14. The same wiring level may include both single-damascene vias 16 and the dual-damascene via 18 and trench 20, which are simultaneously etched and filled.

Direct contact of copper to oxide should be avoided. Copper can diffuse into the oxide potentially causing electrical shorts through the dielectric material. Oxygen can diffuse into the copper reducing its electrical conductivity. Hence, a thin conformal barrier layer 22 is coated onto the sides of the via holes 16, 18 and trench 20 though it is preferably removed from the bottom of the via holes 16, 18 to reduce contact resistance to the conductive features 12, 13. For copper metallization, tantalum nitride (TaN) is the preferred barrier material that blocks the diffusion of either copper or oxygen through it, but a tantalum layer is sometimes first deposited to improve adhesion to the oxide. Other barrier materials, typically involving a refractory nitride such as TiN or WN, have been suggested, and more complex barrier structures than a Ta/TaN bilayer have also been suggested.

The fundamental concept in a damascene process is that the metal, here copper, is deposited to not only fill the via holes 16, 18 and the trench 20 but also over the top surface 24 of the inter-level dielectric layer 14. Chemical mechanical polishing (CMP) is then used to remove the copper extending above the level of the single-damascene via 16 and the dual-damascene trench 20. Because oxide is much harder than copper and has a different type of chemical bonding, the CMP process can be tuned to stop on the top oxide surface 24 after the overlying copper and usually the barrier material have been removed. As a result, the copper is confined to the vias 16, 18 and the trench 20.

The process for depositing copper faces the difficulty of filling via holes having high aspect ratios, that is, the ratio of depth to minimum width. As mentioned before, via widths of 0.13 $\mu$m represent current advanced technology, and further and significant decreases in the critical dimension are being planned. On the other hand, the thickness of the inter-level dielectric is constrained to be no less than about of 0.7 $\mu$m or even greater for more complex structures in order to avoid or minimize cross-talk and dielectric breakdown. Therefore, the aspect ratio of holes to be filled is 5 or greater, and this value will only increase in the future.

Sputtering a metal to fill such high aspect-ratio holes inherently presents difficulties since sputtering is fundamentally a ballistic process ill suited for reaching the bottom of such holes. As illustrated in the cross-sectional view of FIG. 2, if conventional techniques without further embellishments are used to sputter a copper layer 40 into a high-aspect hole 42 formed in a substrate 44, the copper preferentially deposits on the upper corners of the hole 42 to form overhangs 46, which eventually bridge over before the bottom of the hole 42 is filled. As a result, deleterious voids will form. Ionized sputtering, also called ion plating, is known in which a significant fraction of the sputtered copper atoms are ionized. If the wafer being coated is negatively biased, the positive copper ions can be drawn deeply into narrow holes. However, it has been conventionally felt that for sufficiently narrow holes ion plating will still produce excessive overhangs while reducing sputter deposition into the bottom of the high aspect-ratio holes with the resultant formation of voids. If the ion energy is increased too much to reduce the overhangs, the barrier layer at the corner may also be removed, thus exposing the copper to oxide with the accompanying deleterious results mentioned above.

Electro-chemical plating (ECP) has been significantly developed recently to perform the copper fill. ECP is a wet electrolytic process in which a liquid electrolyte containing copper ions flows into the narrow holes and deposits copper nearly conformally on the sides and bottoms of high aspect-ratio holes. ECP has several advantages beyond its conformality. It deposits relatively quickly and uses an inexpensive source of copper. However, ECP has several disadvantages. It is a wet process which is difficult to integrate with the dry plasma processing associated with most of the rest of semiconductor fabrication. Its incompatibility with dry room operation complicates the production queue. Further, since ECP is an electrolytic process depositing onto a dielectric under layer, it is necessary to provide an electrode layer over the dielectric. Nitrides in the barrier layer are insufficiently conducting for this purpose, and even the refractory metals exhibit poor conductivity. As a result, it is conventional to deposit a thin conformal copper seed layer on top of the barrier layer, which not only acts as a plating electrode but also nucleates the ECP copper while adhering to the nitride barrier. Ionized plating of copper performed on wafers held at less than 50° C. has proven effective at forming the copper seed layer. At a minimum, ionized sputtering, when used to form thin copper seed layers, is not so subject to overhangs because only such a small amount of copper needs to be deposited that is insufficient to produce bridging. However, its thickness must be great enough to uniformly cover the dielectric over the vertical extent of the hole. At via diameters of 0.13 $\mu$m and below, the combined thickness of the barrier layer and the copper seed layer further narrows the hole, increasing its effective aspect ratio. The copper seed deposition also introduces an additional process step.

Finally, ECP may not be sufficient for the very high aspect-ratio holes anticipated for 90 nm processing. If any overhangs exist from the barrier or seed layer deposition, the generally conformal ECP deposition may cause the top of the hole to bridge over before the bottom of the hole is filled, thereby creating voids in the via metallization. Further, ECP relies upon the flow of fresh electrolyte into the hole and the removal of depleted electrolyte from it. Since electrolyte replenishment is more effective at the top of the hole, ECP is likely to form its own overhangs which may close the hole before the hole is filled. That is, voids in the copper may still develop with ECP.

Ding et al. in U.S. Pat. No. 6,184,137 describe a copper fill procedure in which the fill is only incompletely performed such that a thin capillary is formed to extend vertically down the center of the via hole. The copper is then reflowed at above 450° C. to fill the capillary. Ding et al. in published European Patent Application EP 0 878 843 A2 describe a multi-step copper sputtering process involving different temperatures. Chiang et al. in U.S. Pat. No. 6,398,929 disclose a copper seed layer deposited by SIP followed by a higher-temperature sputter deposition of copper.

There is much prior art for cold/hot aluminum sputtering processes, but this work is not obviously transferrable to copper sputtering because copper's melting point of 1093° C. is much higher than the 660° C. of aluminum, the higher temperature being totally incompatible with previously formed structure such as shallow dopant implant profiles, thin gate oxides, and organic low-k dielectrics while the lower temperature is much closer to temperatures tolerable by these features.

SUMMARY OF THE INVENTION

In one aspect of the invention, a via hole or other type of hole formed in a substrate is filled with copper in a two step sputtering process. The first step is performed with the substrate held at a relatively low temperature, for example, less than 100° C. The second step is performed with the substrate held at relatively high temperature, for example, 200 to 450° C., more preferably 300 to 400° C. to thereby fill the hole with copper. The first step includes at least some portions in which the energy of the sputtered copper ions is kept relatively high, for example by adjusting the pedestal bias to be greater than 100V, while the second step includes at least some portions in which the energy is kept low, for example, bias voltages of no more than 60 or 85V.

Optionally, both steps include bias pulsing with alternating periods of low and high bias.

The two steps may be performed in the same sputter reactor or in different sputter reactors, perhaps of different designs.

Advantageously, in the second step, sputtering is begun before the substrate has been raised to its final value, thereby reducing agglomeration and delamination of the first layer during the warming process.

Another aspect of the invention includes the addition of a gas to the sputtering plasma to promote surface diffusion of the copper. Hydrogen is the preferred gas. Helium may also be used.

The hydrogen or other gas addition is particularly useful in the second step of the two-step process having a higher temperature in the second step. However, the gas addition may be added in both steps, or may used in other copper sputtering processes.

DETAILED DESCRIPTION OF THE PREFERRED EMBODIMENTS

Figure 1:
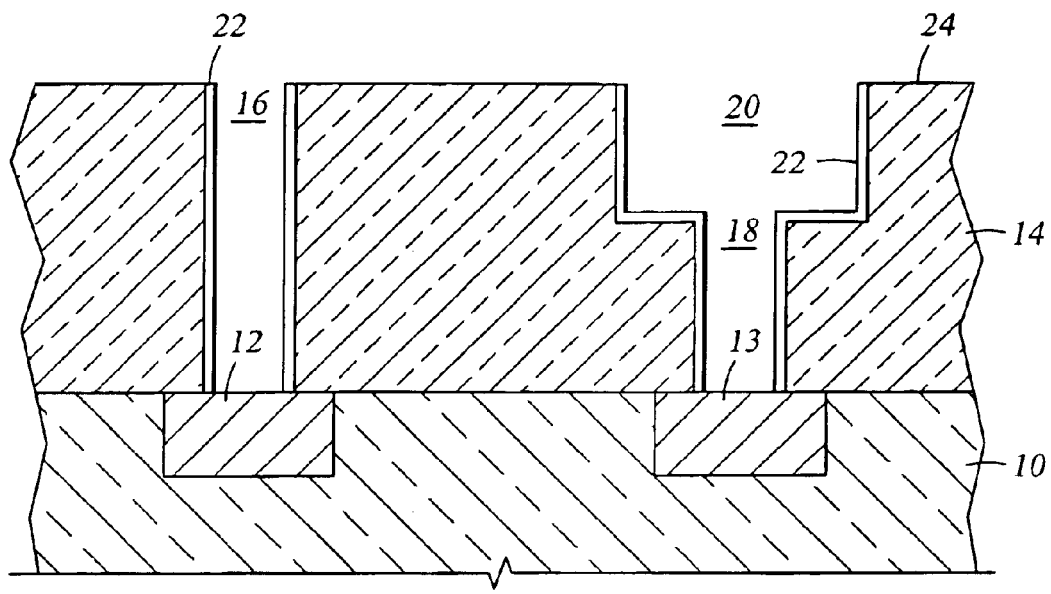
FIG. 1 is a cross-sectional view of two types of damascene structures.
Figure 2:
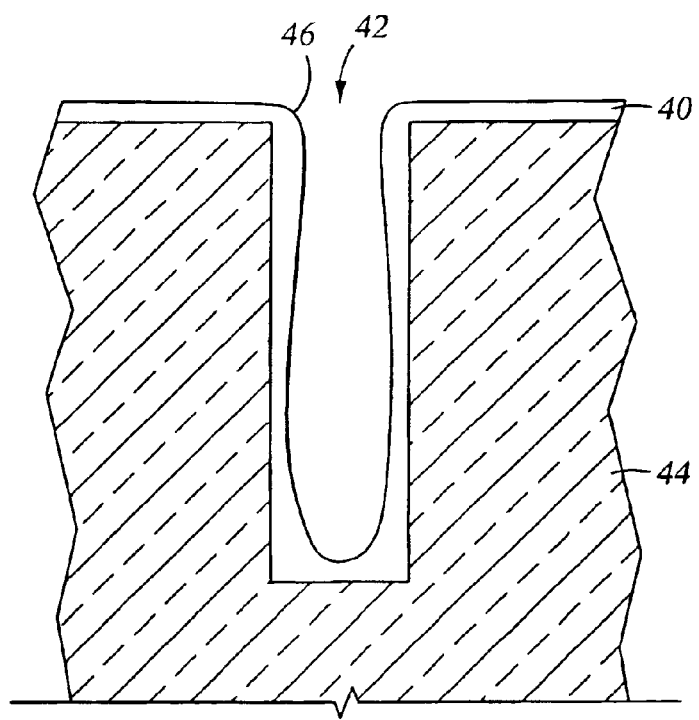
FIG. 2 is a cross-sectional schematic view of the overhangs produced by conventional sputtering.

One aspect of the invention allows a copper sputtering sequence which fills a interconnect structure, particularly a dual damascene structure, without the use of electrochemical plating (ECP). The process is summarized in the flow diagram of FIG. 3. In step 50, a damascene or other interconnect structure is etched into an inter-level dielectric layer. An example of a dual-damascene structure illustrated in the cross-sectional view of FIG. 4 is taken along a different section line than in FIG. 1 to show some of the novel effects of the invention. An inter-level dielectric layer 52 is deposited over a lower-level dielectric layer 54 having conductive features 56, 58 formed in its surface. The dielectric layers 52, 54 may be formed of silicon oxide or related silicate glasses or may be formed of a low-k material as is well known in the art. The conductive features 56, 58 may be a lower-level copper metallization. If the lower layer 54 is a silicon layer incorporating the active semiconductor devices, the features 56, 58 may be polysilicon with intermediate barriers and contacting layers. For simplicity of discussion, only a lower dielectric layer 54 will be discussed, but most aspects of the invention apply as well to the lowest metallization layer on top of the active silicon layer. An example of the dual damascene structure includes two via holes 60, 62 formed over respective conductive features 56, 58 operating as vertical interconnects and connected at their top to a trench 64 operating as a horizontal interconnect. The trench 64 is typically at least twice as wide as the via holes 60, 62. Its length may be relatively short as illustrated or it may extend over significant distances to interconnect remote areas of the integrated circuit chip. The etching of the dual damascene structure is well known (see, for example, U.S. Pat. No. 6,387,287 to Hung et al.) and may involve the use of a silicon nitride etch stop layer in the middle of the oxide layer 52 to define the floor of the trench 64.

Although the photoresist patterning is typically done in separate dedicated equipment, the etching and associated cleaning steps may be performed by one or more plasma etching reactors each processing a single wafer at a time. Thus the etching and cleaning steps can be easily integrated into a clean room sequence.

In step 66, a barrier layer 66 is deposited generally conformally upon the upper oxide layer 52 on the sides of the vias 56, 58 and trench 64. The barrier layer 68 acts as a diffusion barrier between the oxide layer 52 and the copper later filled into the vias 60, 62 and trench 64. Diffusion of copper into the oxide may cause a short and diffusion of oxygen from the oxide into copper may increase its resistivity. The barrier layer 68 for copper metallization is typically a bilayer of Ta/TaN, where the tantalum metal acts as an adhesion layer and the nitride layer as the diffusion barrier. However, other barrier compositions and combinations have been proposed. It is preferred that the barrier layer 68 not be deposited at or that it be removed from the bottom of the vias so that contact resistance is reduced. The illustration shows the barrier layer 68 covering a field area 70 on top of the dielectric layer 52 and a trench bottom 72 near the middle of the dielectric layer 52. In practice, the situation is complicated by etch stop layers and hard mask layers, which will not be addressed in this description. It is noted however that the barrier layer 68 has a first set of corners 74 located between the field area 70 and the nearly vertical wall at the top of the trench 64 and a second set of corners 76 located between the trench bottom 72 and the nearly vertical wall of the vias 60, 62. The exposed locations of the corners 74, 76 subject them to excessive etching in the resputtering processes to be described for some aspects of the invention. If care is not taken in some situations, the exposed corner geometry increases the corner etch rate and may result in faceted or beveled corners in which the barrier layer 68 at the corners 74, 76 has been removed exposing the underlying oxide 52 to the after filled copper, a clearly undesired result.

Techniques of depositing a thin conformal barrier layer are well known and may involve sputtering, also known as physical vapor deposition (PVD), or chemical vapor deposition (CVD), or a combination of the two. Thus, the barrier deposition may be a dry process that may be performed in one or more single-wafer reactors so the barrier formation is again easily integrated into a clean room operation.

Figure 5:
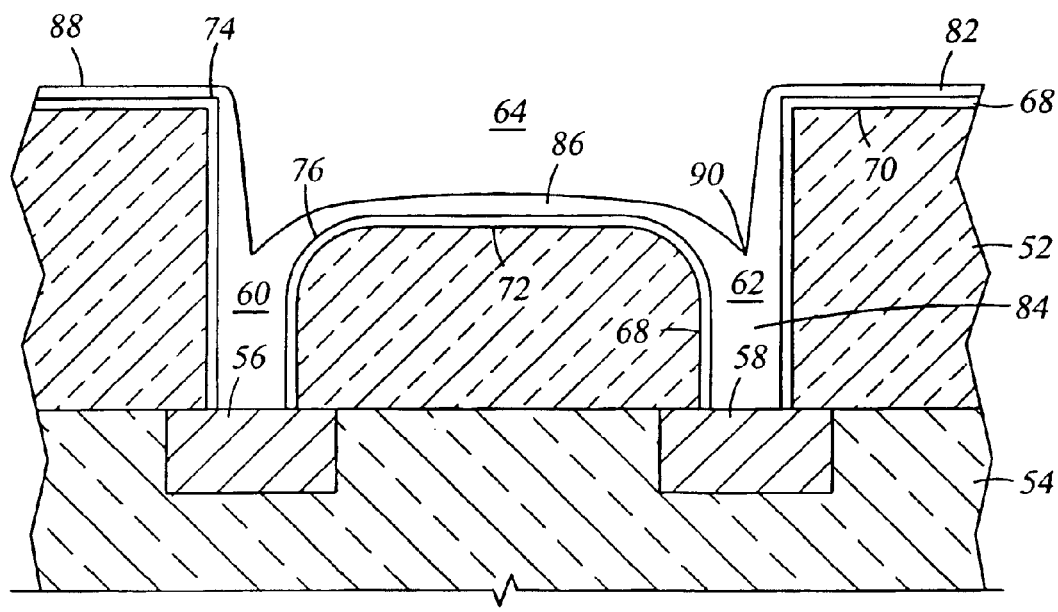

According to one aspect of the invention, the copper is filled and overfilled into the dual-damascene structure in a two-step operation. In one embodiment of the invention, a first copper sputtering step 80 of FIG. 3 may be characterized as a cold sputter deposition with high-energy copper ions which produces a first copper layer 82 illustrated in the cross-sectional view of FIG. 5. High wafer biasing increases the ion energy although target power and chamber pressure have some effect. The sputtering process parameters of the first sputtering step 80 are tuned to produce the illustrated structure that has a via fill 84 extending toward the top of the vias 60, 62, a relatively thin trench floor portion 86 near the bottom of the trench 64, and typically an even thinner field portion 88 on top of the dielectric layer 52. Localized cusps 90 form at the top surface of the first copper layer 82 within the via holes 60, 62. Preferably the first step 80 is continued until the cusps 90 form in the upper halves of the via holes 60, 62 or perhaps higher so that at least the lower halves of the via holes 60, 62 are uniformly filled with no voids or other cavities extending to the exposed upper surface, thereby reducing the effective aspect ratio for filling the remainder of the via holes 60, 62 if the first step 80 has not already done so. If desired, the copper sputter reactor may be used with high wafer biasing to remove the barrier layer 68 at the bottom of the vias 60, 62 before copper is deposited on net at the via bottom.

The first sputtering step 80 may be performed with the wafer held at a relatively low temperature of, for example, less than 100° C., typically less than 50° C., so that the copper adheres well to the sidewalls of the via holes 60, 62 and forms a smooth layer. Cathode temperatures of as low of −40° C. are easily achievable. The first sputtering step 80 is also performed with a relatively high ionization fraction of the sputtered copper atoms, for example, at least 25%, and with wafer biasing and other process parameters adjusted to cause the copper ions to strike the wafer with relatively high energy, for example at between 50 and 200 eV. A higher ionization fraction is generally achieved with higher target power, higher wafer bias power, and reduced pressure, for example, less than 0.2 milliTorr, which nonetheless can support a plasma for copper sputtering. The high wafer biasing draws the copper ions deep within the via holes 60, 62 to assure bottom coverage. At these high ion energies, however, the copper ions tend to not stick to the via bottom but to be reflected from it. Nonetheless, the very confined volume within the high-aspect ratio vias 60, 62 causes the reflected energetic copper ions, perhaps neutralized, to bounce around within the via holes 60, 62 and perhaps to dislodge already deposited copper atoms as well as the barrier material at the via bottom. As a result, the ion energy is gradually dissipated, and the copper ion and resputtered copper atoms deposit within the via holes 60, 62 to provide a fairly uniform via fill 84 with no voids. The bottom coverage may be lower than the sidewall coverage, resulting in the cusps 90.

On the other hand, the bottom of the trench 64 has a more exposed geometry. The high-energy incident ions are likely to dislodge copper already deposited there, that is, to resputter the trench floor 72, and the resputtered atoms are likely to escape the trench 64 without further collision. As a result, the copper trench floor portion 86 is relatively thin. The field area 70 on top of the dielectric layer 52 is even more exposed so that the copper field portion 88 is even thinner because of resputtering by the high-energy copper ions. It has been observed that in exposed planar geometries, copper ions having an energy of greater than about 100 eV do not stick and at significantly higher energies will etch rather than sputter deposit.

The high-energy copper ions also prevent overhangs from forming at the corners 74, 76. Such overhangs would shield the portions of the via holes 60, 62 beneath them, which would degrade the bottom coverage in the high aspect-ratio via holes 60, 62. However, care must be taken to assure the copper ion resputtering does not excessively bevel the barrier layer 68 at the corners 74, 76 so as to expose the underlying oxide layer 52. The resputtering of via fill 84 begins to dominate when the cusps 90 rise above the level of the trench floor 72, thereby significantly reducing the subsequent deposition rate. Hence, it is advantageous to continue the first sputtering step 80 until the cusps 90 are located in the upper halves of the vias 60, 62. As a result, there is no non-filled volume (at least connected to the top surface) in the lower half of the vias 60, 62, that is, the lower half is filled.

The sputtering conditions during the first sputtering step 80 may be close to those already known for depositing a copper seed layer. Unlike copper seed sputtering, however, the duration of the sputtering is considerably longer in order to deposit 10 to 20 nm of copper on the via sidewalls and to fill the lower half of the via holes 60, 62.

The desired deposition profile of the first step is promoted by alternating low and high wafer biasing even while maintaining substantially constant target power and chamber pressure. High wafer biasing is effective at preventing overhangs and reducing the thicknesses of the field area 82 and the trench floor area 86. It is nonetheless effective at filling the bottom of the via holes 60, 62 because the resputtered or reflected copper ions are likely to have lower energies and to bounce around within the narrow via holes 60, 62. However, energetic copper ions do not stick to the angular bevels 76 because of the inclined incident angles but tend instead to further etch the bevels 76. If the barrier layer 68 is etched through at the bevels 76, the underlying oxide 52 is directly exposed to the later deposited copper, causing significant reliability problems. On the other hand, low wafer biasing produces copper ions with lower energy and with a more isotropic distribution of both ions and neutrals. Such a copper flux readily deposits on the corners 74, 76 and indeed tend to form overhangs there. Nonetheless, the underlying barrier corner is protected. A subsequent high-energy phase removes the overhangs.

Figure 6:
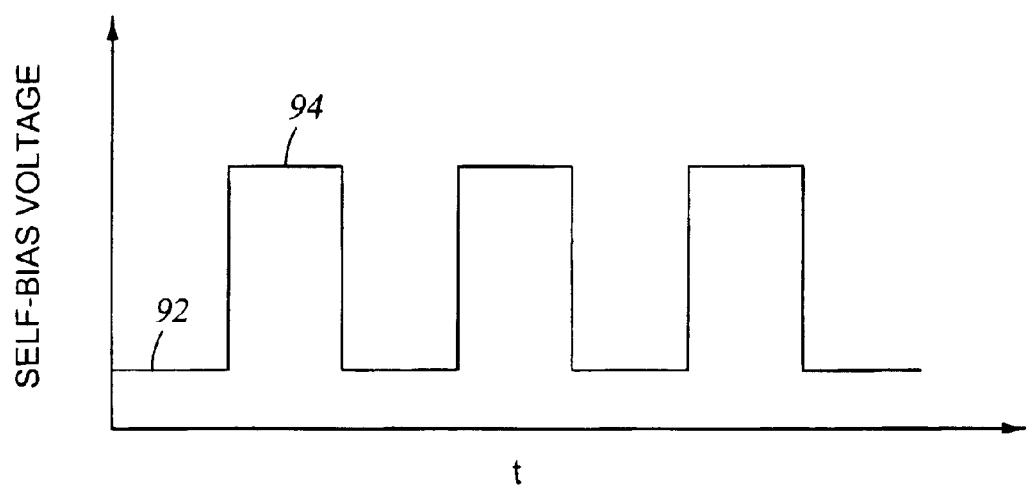
FIG. 6 is a timing diagram illustrating pulsed bias sputtering.

In pulsed biasing, as illustrated in the bias timing diagram of FIG. 6, the negative self-bias voltage alternates between a low level 92 and a high level 94. The initial step preferably employs the low level 92 unless it is desired to remove the barrier layer at the via bottom. The low level 92 may correspond to a floating negative self-bias, that is, the self-bias that develops even without applying a significant amount of RF power to the capacitively isolated pedestal electrode while the high level 94 corresponds to a finite level of RF power, for example, at least 10 times that applied for the low level 92. In a 200 mm chamber held below 0.5 milliTorr, the self-bias voltage at relatively low target powers has been observed to be 60 to 70V. The self-bias voltage increases to 85V as target power is increased to 40 kW. Thereafter, it decreases to 65V as the target power is further increased to 80 kW.

During the low-level periods 92, the ionized particles, whether copper or argon, are not significantly accelerated and have relatively low energies. The conditions produce a low-energy, more isotropic flux that favor deposition rather than sputter etching on the exposed planar portions including the bevels 76. Sputter etching of the exposed corner and planar areas is reduced. As a result, deposition predominates in the exposed areas to the extent that overhangs tend to form at the top of the via holes 60, 62. However, deposition at the bottom of the via holes 60, 62 is low because of the protected geometry. On the other hand, during the high-level periods 94, conditions favor sputter etching of the exposed areas including the bevels 76 but promote deposition deep within the vias 60, 62. The optimal combination during the high-level periods 94 removes as much of the copper deposited on the bevels 76 as is deposited during the low-level periods 92.

The high-level conditions resemble those used during sputter deposition of a copper seed layer in a sputtering reactor affording a high-ionization fraction for the sputtered copper, but even for the individual phases the sputtering may be longer than for a copper seed layer. This longer duration of high-level biasing would tend to etch through the barrier bevels 76 if the pulsed sputtering process were not used. It has been found that using two or preferably three or possibly more cycles of low and high bias sputtering is effective at filling the lower portion of the via holes 60, 62. For 200 mm wafers, a high bias power of 800 to 1000 W applied to a floating capacitively coupled pedestal electrode supporting the wafer has been found effective in combination with a low bias power of 0 to 50 W for 2 s. Even zero bias power, it is noted, produces a finite self-bias voltage.

Figure 3:
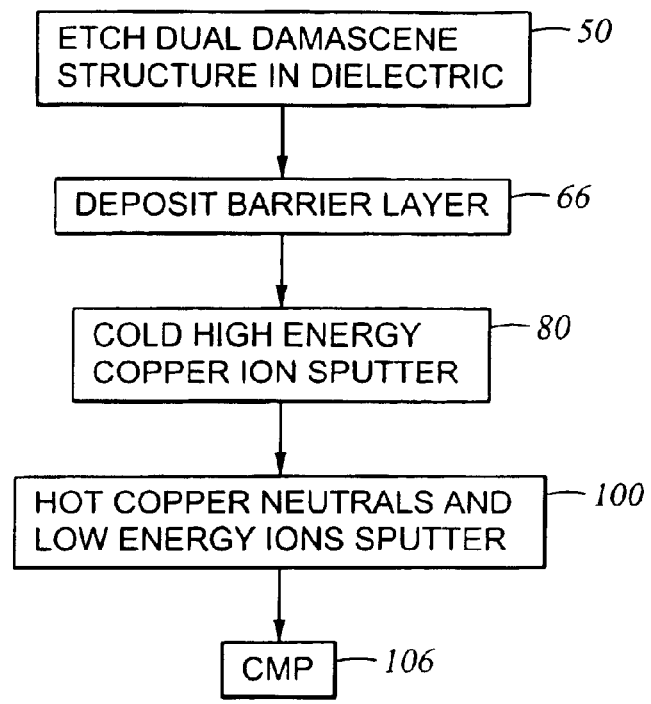
FIG. 3 is flow diagram of a process for etching and sputter filling a dual-damascene interconnect structure with copper.
Figure 4:
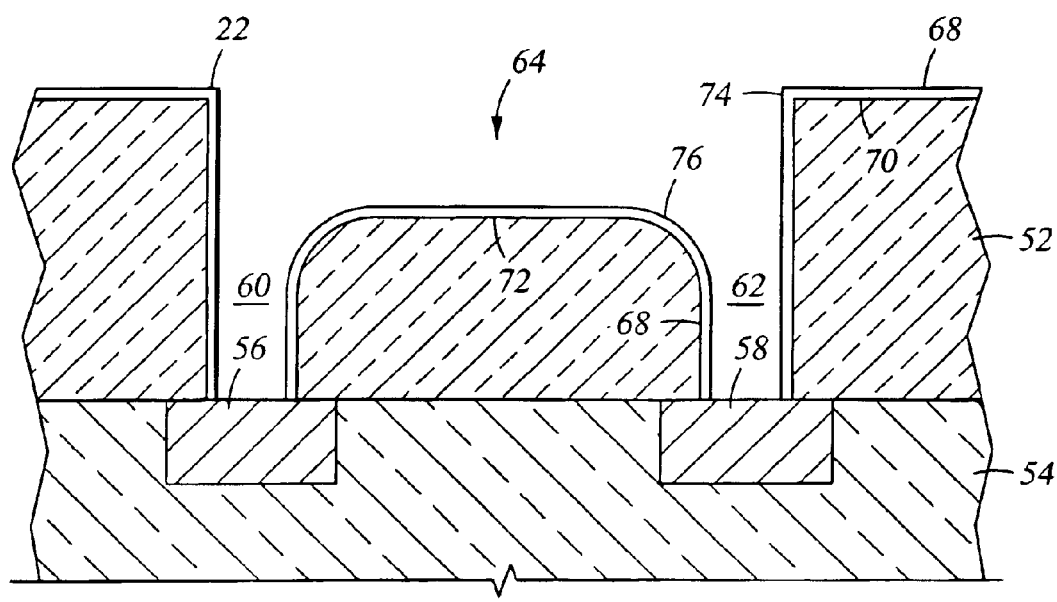
FIGS. 4, 5, 7, and 8 are cross-sectional views illustrating the structure being developed in the process of FIG. 3.
Figure 7:
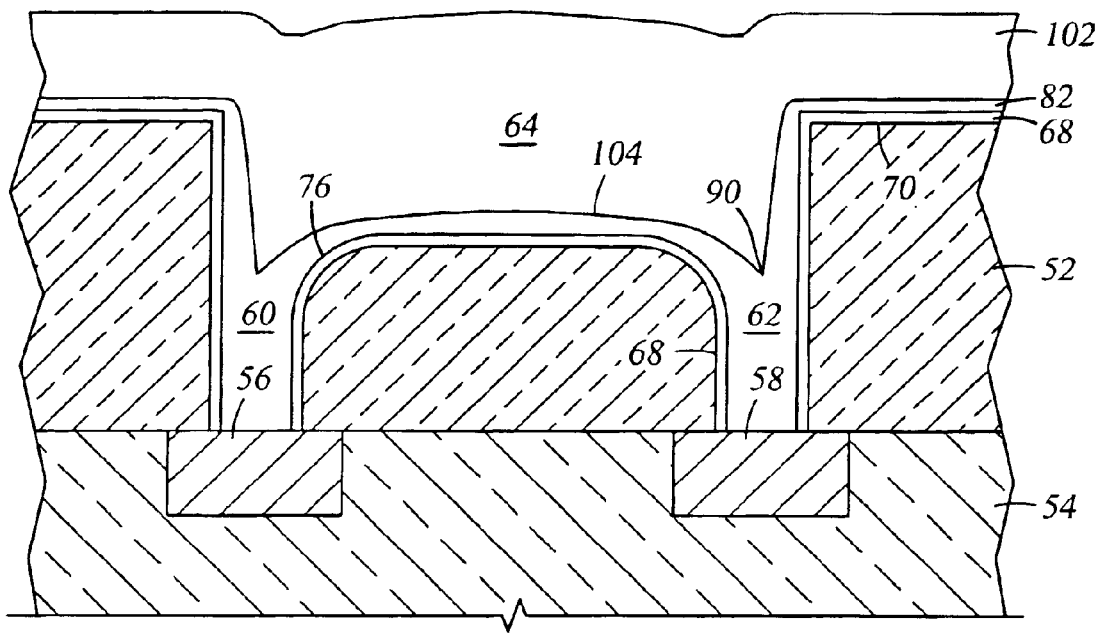

A second sputtering step 100 of FIG. 3 is characterized as being relatively hot. The second step may also produce a more neutral flux of copper atoms and copper ions of lesser energy. The sputtering parameters are tuned to produce, as illustrated in FIG. 7, a second copper layer 102 that fills and overfills the trench 64 and over the top of the field area 70 in a generally planarizing sputter deposition. The wafer is maintained at a temperature of, for example, between 200° to less than 600° C., preferably between 300° and 450° C., which promotes the diffusion of recently deposited copper. Whatever ions are produced have relatively lower energy and do not significantly resputter. For dual-damascene, deep hole filling is not required for the second step of filling the trench 64 so that wafer biasing is not critical. Accordingly, although the ionized sputter reactors may be used with reduced wafer bias and possibly lower target power, a conventional diode plasma sputter reactor with a copper target may be used. Its generally isotropic sputtering pattern is not a significant problem, particularly in view of the planarizing reflow of copper into the trench 64.

Although the second sputtering step 100 is performed at a relatively high temperature, it is still far below the melting point of copper. As a result, it is believed that the copper does not reflow in the typical sense and the two copper layers 82, 102 do not substantially mix but an interface 104 is formed between but has little electrical effect. Instead, it is believed that the surface atoms readily diffuse toward thermodynamically more favorable locations, such as the cusps 90, before being locked in the aggregating sputter deposition. Nonetheless, the relatively high wafer temperature tends to planarize the sputter deposited layer. If the two copper layers 82, 102 are deposited in different reactors, it may be necessary to clean the interface 104 before the second layer 102 is deposited.

It has been found, however, that the initiation of the high temperature sputtering needs to be modified from the usual practice of chucking the wafer on a relatively cool pedestal and then raising the pedestal temperature to the desired level before beginning sputtering. It has been found that this practice tends to cause the already deposited first copper layer, which is relatively thin in some portions, to partially delaminate and agglomerate during the warm up. The preferred practice then is to begin the sputtering shortly after the wafer has been chuck and to continue it while the pedestal temperature is being raised to the desired level, typically over a period of about 20 s.

The two copper sputtering steps 80, 100 complete the filling of the via holes 60, 62 and the trench 64. That is, there is no unfilled volume at least connected to the surface in either the via holes 60, 62 or the trench 64. Both sputtering steps 80, 100 are conveniently performed in one or two single-wafer plasma etching reactors, again easily integrated in a clean room process sequence.

Figure 8:
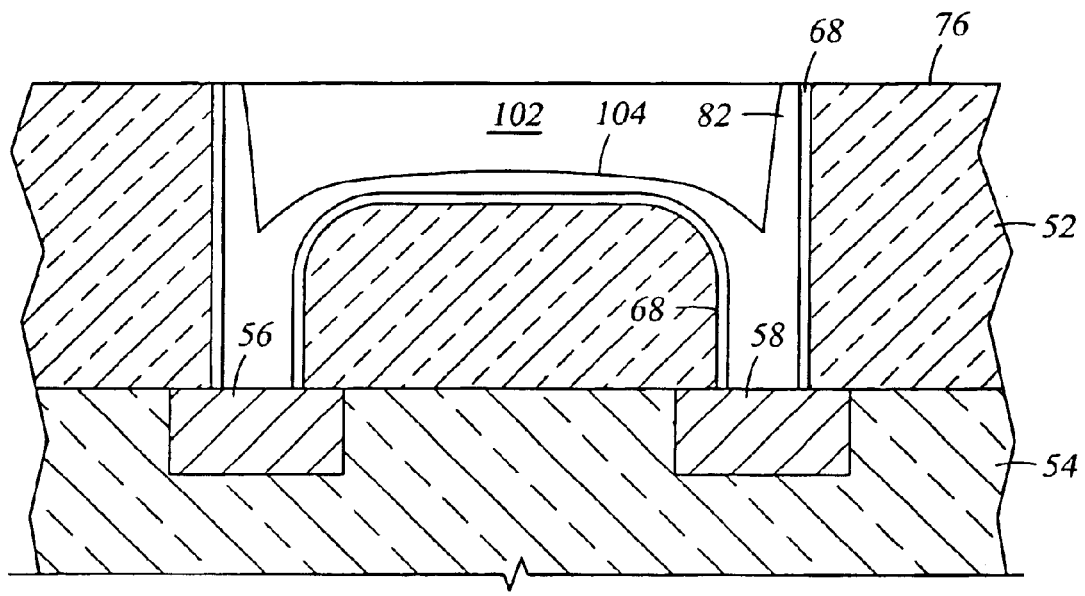

After the copper fill has been completed, in step 106 of FIG. 3 the wafer is subjected to chemical mechanical polishing (CMP) to remove the softer copper exposed outside of the trench 64 to produce the structure illustrated in the cross-sectional view of FIG. 8. Typically, CMP also removes the barrier layer 68 above the field area 70 but stops on the harder oxide 52. Again, the interface 104 in a well developed process has little effect on the operation of the final device.

The discussion before concentrated on filling the dual-damascene structure of FIGS. 4, 5, 7, and 8. However, many copper interconnect designs include not only a dual-damascene interconnect having a wide trench in the upper part of the dielectric layer but also a single-damascene interconnect, such as the via 16 in FIG. 1, in which a narrow via extends from top to bottom of the dielectric layer. Filling copper into such a simple but high aspect-ratio via with a sputtering process presents difficulties. The first sputtering step described above remains effective at filling the bottom of the via hole 16 without forming excessive overhangs. However, the second sputtering step may need adjustment to prevent bridging and the formation of voids.

For such a geometry, the second, hot sputtering step may be modified to include the pulsed biasing described previously for the first, cold sputtering step. Again, a low bias level promotes planar deposition and protection of the barrier layer at the exposed corners of the via hole while a high bias level deposits ions deep within the via hole and removes excessive overhangs. Further, the hot temperature during the second step promotes surface diffusion and planarization within the via hole.

Sputtering to produce a high copper ionization fraction can be performed with a variety of sputtering reactors, which for the most part can also be operated to produce a low copper ionization fraction. One method, often called ionized metal plating (IMP), not only DC biases the sputtering target but also relies upon an inductive coil wrapped around the chamber to inductively couple a substantial amount of RF energy into the sputtering chamber to thereby increase the plasma density. IMP can achieve relatively high ionization fraction of over 50%. However, IMP typically operates with a chamber pressure of above 50 milliTorr and tends to be a hot process. Accordingly, IMP is disfavored for the first, cool step but may be used in the second, warmer step with the understanding that biasing of the pedestal should be relatively low.

Fu et al. describe in U.S. Pat. No. 6,306,265, incorporated herein by reference in its entirety, another type of sputter reactor capable of highly ionized sputtering relies on self-ionized plasma (SIP) sputtering and available from Applied Materials, Inc. of Santa Clara, Calif. High power is applied to the target, and a small unbalanced magnetron with high magnetic strength sis scanned about the target, thereby concentrating the sputtering plasma in a small area of the magnetron, result in very high power density and a high plasma density resulting in a reasonably high ionization fraction. The ionized copper ions act to resputter the copper target so that the chamber pressure can be reduced to 0.5 milliTorr and less, resulting in a relatively cool process. Furthermore, the unbalanced magnetron projects a magnetic field component toward the wafer to guide the copper ions. SIP sputtering has the advantage of a flat target and a generally conventional DC diode plasma sputter reactor. A variant described by Hong et al. in U.S. patent application Ser. No. 10/152,494, filed May 21, 2002 uses a planetary scanning mechanism, which allows use of a yet smaller magnetron while maintaining target uniformity.

Two other types of sputter reactors rely on complexly shaped targets. A hollow cathode magnetron (HCM) reactor, for example, as described by Lai et al. in U.S. Pat. No. 6,179,973, includes a target with a single cylindrical vault facing the target and sidewall magnets to confine the plasma in the vault. An SIP+™ plasma sputter reactor, available from Applied Materials, is described by Gopalraja et al. in U.S. Pat. No. 6,451,177, incorporated herein by reference it its entirety. Its target is formed with an annular vault having opposed unbalanced magnets on its two sidewalls of the vault and a small intense magnetron scanned along the vault roof. The unbalanced magnets guide the ionized particles to the wafer. Although both types are capable of higher ionization fraction and at least the latter allows different operational modes, shaped targets are more expensive than the conventional flat targets.

Any of the sputter reactors described above are capable of producing a relatively high copper ionization ratio, particularly if a large amount of power is applied to the target. All of them also are amenable to wafer biasing, which provides a control of the energy of the copper ions incident on the wafer.

The discussion will now concentrate on the mechanism for controlling sputtering conditions which differentiate the two sputtering steps or their substeps. A typical diode sputtering chamber is schematically illustrated in cross section in FIG. 9. It includes a metallic chamber body 110, which is electrically grounded, although typically unillustrated grounded shields are placed inside the chamber body 110 to protect the chamber itself from being sputter coated. A sputtering target 112 of the copper or other metal to be sputtered is supported on the chamber body 110 through an isolator 113, which electrically isolates the two while providing a vacuum seal. The illustrated target 112 is flat. The targets of the previously described HCM or SIP$^+$ reactors have more complex shapes. A gas source 116 supplies a sputtering working gas, such as argon, through a mass flow controller 118 into the chamber in back of unillustrated sputtering shields used to protect the chamber walls from sputter deposition. A vacuum system 120 pumps the chamber through a pumping port 122 to a pressure in the vicinity of about 2 milliTorr for ignition and often to less than 0.5 milliTorr once the plasma has been ignited. For copper sputtering in reactors producing a high ionization fraction, it is possible after the plasma has been struck to reduce or even eliminate the argon flow since under the right conditions the copper ions can partially or fully support the sputtering plasma. A DC power supply 124 applies a selectable amount of negative DC power to the target, typically in the range of about −400 to −800 VDC, to ignite and thereafter maintain the plasma. The DC power control is typically stated in kilowatts. An inductively coupled high-density plasma reactor, such as the previously described IMP apparatus, would include another RF source connected to an RF coil wrapped around the processing space inside the chamber between the target 112 and a pedestal electrode 126.

A magnetron 130 is positioned in back of the target 112 to create a magnetic field in front of the target 112. The field traps electrons, thereby increasing the plasma density in a high-density plasma region 132, which greatly increases the sputtering rate and may be effective at increasing the ionization fraction. For the relatively small magnetrons of the SIP design, the magnetron 130 needs to be scanned about a center axis 134 of the reactor to provide more uniform sputtering of the target 112. For a planetary scanning mechanism, the scanning is performed in the radial direction as well. The magnetrons for a hollow-cathode magnetron reactor and for an SIP$^+$ reactor are of significantly different design, as described in the cited references. For more conventional diode sputter reactors, the magnetron is typically considerably larger and is formed of closely spaced opposed poles arranged in a closed band, for example, having a kidney shape. Such a large magnetron is also rotated to promote uniformity.

The pedestal electrode 126 supports a wafer 140 to be sputter coated within the vacuum chamber in opposition to the target 112. The support area of the pedestal electrode 126 is electrically isolated from the chamber body 110 so that an RF power source 142, for example, outputting at 13.56 MHz, coupled to the pedestal 126 through a capacitive coupling circuit 144 can electrically bias the wafer 140 supported on the pedestal electrode 126. The coupling circuit 144 acts as a high-pass filter so that the pedestal 126 can be driven by the RF power while its DC level can float. Even without any RF bias, the electrically floating pedestal 126 in the presence of a plasma of positive ions within the chamber develops a negative self-bias. Further RF biasing power increases the magnitude or level of the negative self-bias voltage.

The temperature of the wafer 140 during sputter deposition can be controlled by both cooling and heating means. A controllable chiller 146 recirculates cooling liquid to a circuitous cooling path underlying the wafer support area of the pedestal 126. Chilled refrigerant may have a temperature of less than −50° C. Conversely, a controllable power supply 148 supplies heating current to a resistive heater 150 in the pedestal 126. Another gas source 152 supplies a thermal control gas such as helium through a mass flow controller 154 to a circuitous cavity 156 between the wafer 140 and the cooling and heating means. The control of gas pressure in the gas cavity 156 significantly and quickly controls the thermal coupling to the wafer 140 and hence its temperature. An unillustrated electrostatic chuck embedded in the pedestal 126 selectively holds the wafer 140 to the pedestal 126 against the pressure of the thermal control gas. In some types of low-pressure sputtering envisaged for some phases of the invention, the supply of argon is completely cut off after plasma ignition and the only gas supplied to the interior of the chamber is the helium that leaks around the wafer.

The invention was tested using SIP$^+$ sputter reactors with shaped copper targets sized for 200 mm wafers. In the first step, the pedestal was held at a somewhat elevated temperature of +40° C. with a backside helium flow of 1 sccm. Argon flow was 4 sccm. Wafer biasing was 500 W, and sputtering continued for 25 s. In the second step, after wafer chucking, sputtering was started and the pedestal temperature was then raised to 350° C. The pedestal electrode was electrically floating with no applied bias power. Sputtering continued for 80 s to complete the fill. This two-step process could be performed in a single SIP$^+$ reactor, but it is felt that with further optimization the second step could be performed in a diode reactor with a flat target.

Another test in the same reactor included pulsed biasing. In the first cold step, the target power was 80 kW. The bias power was pulsed between 20 W and 800 W, each with a 2-second period. No thermal transfer gas was used. The total deposition time was 40 s. In the second hot step, the target power was 60 kW, and the bias power was zero resulting in 50V of negative self-bias. The cooling gas was supplied at 4 sccm to produce a wafer temperature of 300° C.

The enhanced diffusion of the second step described above is achieved in part by the relatively high wafer temperature. Although the described 300° C. is considered acceptable in the thermal budget of the wafer, it is generally considered better practice to maintain the wafer temperature as low as possible. A reduced temperature of no more than 100° C. would be desirable, but such low temperatures are not effective at increasing the surface diffusion of copper.

The need for thermal activation of the surface diffusion can be reduced by kinetic activation provided by relatively high energy ions. As mentioned above, highly biased copper ions promote the non-conformal coating of a prolonged first sputtering step, however at the risk of sputter etching through the barrier layer. The use of such heavy (atomic weight of 63.54) energetic ions is even less useful in the second step where they can etch or resputter the surface and reduce the net deposition rate in the more exposed geometry.

Figure 9:
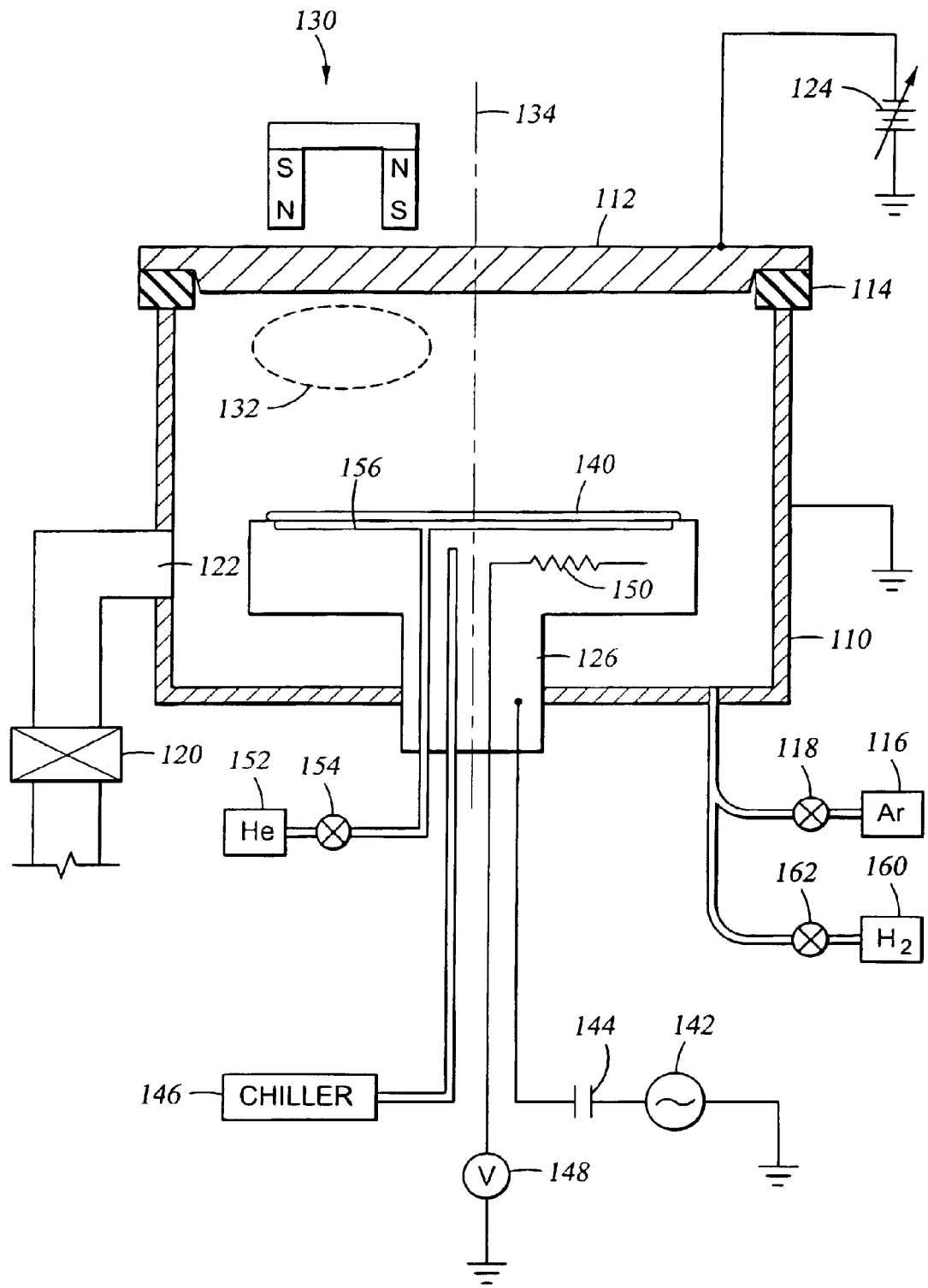
FIG. 9 is a schematic cross sectional view of a sputtering reactor.

Energetic hydrogen ions can also promote surface diffusion while their unity atomic weight significantly reduces their etching effect. Accordingly, as illustrated in FIG. 9, a source 160 of hydrogen gas is connected to the sputtering reactor through an associated mass flow controller 162. The plasma is believed to dissociate the $H_2$ gas into hydrogen radicals H* and atomic hydrogen ions H+ as well as electrons. An atomic hydrogen source in association with an argon sputter gun is described by Miyake et al. in "Effects of atomic hydrogen on Cu reflow process," *Stress Induced Phenomena in Metallization*, Fourth International Workshop, eds. Okabayashi et al. (American Institute of Physics, 1-56396-682-4, 1998), pp. 419–424. Hydrogen energies of 0.48 eV are shown to be effective in promoting copper diffusion. It is believed that atomic hydrogen is effective at breaking the copper metal bond to thereby free copper for diffusion. In one aspect of the invention, the hydrogen activation can be performed in situ during the copper sputter deposition by using same plasma that ionizes the argon to also crack the hydrogen into one of its atomic forms.

Hydrogen gas may be supplied in essentially pure form. However, pure hydrogen gas is highly flammable. Accordingly, it is typical practice to supply a hydrogen/helium ($H_2$/He) in which the hydrogen fraction is about 4%. Safety considerations limit the hydrogen fraction to no more than 5%. Although helium has an atomic weight of 4 versus hydrogen's atomic weight of 1, it nonetheless is much lighter than copper and thus more effective in activating the diffusion by breaking the copper metal bonds without inducing resputtering.

Other gases may be considered for activating the copper diffusion as long as they do not react with copper. Nitrogen may be considered since it has a relatively low atomic weight of 14, which is much less than atomic weight of copper, but energetic nitrogen ions are nonetheless more prone to sputter etching. Rozbicki has described in U.S. Pat. No. 6,440,854 the addition of nitrogen gas during sputter deposition of a copper seed layer to prevent agglomeration prior to electroplating. Rozbicki states that nitrogen prevents agglomeration by decreasing the high surface diffusion of copper because of the formation of long-lived copper nitride radicals, which would be much larger than any copper hydride radicals. Miyake et al., describe the use of 500 eV argon ions for promoting surface diffusion of copper. However, argon ions having an atomic weight of 39.95 are much more prone to etching. Neon is another readily available inert gas having an atomic weight of 20.2 so that it is more advantageous than argon but less so than helium. Oxygen and the halogen gases are not useful because of their reactivity. For these reasons, hydrogen and helium appear to provide the best diffusion activation with little opportunity for sputter etching. However, the effects of helium alone have not yet been demonstrated, and hydrogen offers chemical as well as kinetic effects.

The above described gas enhanced diffusion is effective in the second sputtering step. In the second step, the ionization fraction of copper is not so important if the surface diffusion is otherwise activated. Accordingly, a more conventional diode sputter reactor may be used in conjunction with the gas enhanced diffusion.

On the other hand, hydrogen enhanced diffusion and other gas enhanced diffusion may be used in the first sputtering step as well since hydrogen will promote diffusion during the cold sputtering step to more effectively fill the bottom of the via. Since the hydrogen is promoting diffusion, the cold deposition becomes less necessary in achieving a smooth initial layer. Taken to the limit, a single hydrogen enhanced sputtering step may be used to initiate and complete the copper filling of the bottom of a high aspect-ratio hole.

The different aspects of the invention are effective at promoting sputtering copper into high aspect-ratio holes with copper. The invention also allows the filling of high aspect-ratio holes with copper without the need for electrochemical plating. These beneficial effects are achieved without unduly complicating the copper sputtering process and allows the use of less expensive reactors for major portions of the sputter fill.

What is claimed is:

1. A method of sputter filling copper into a hole formed in a dielectric layer in a substrate, comprising the steps of:
    a first step of sputter depositing copper into said hole including holding a temperature of said substrate at a first temperature of less than 100° C. and filling a bottom half of said hole; and
    a second step of sputter depositing copper into said hole including holding said temperature of said substrate at a second temperature of greater than 100° C. to completely fill said hole.

2. The method of claim 1, wherein said second temperature is at least 200° C.

3. The method of claim 1, wherein said second temperature is no more than 450° C.

4. The method of claim 3, wherein said second temperature is at least 300° C.

5. The method of claim 4, wherein said temperature is ramped up to said second temperature during said second sputtering step.

6. The method of claim 1, wherein said hole is precoated with a barrier layer and wherein no further copper layer is deposited on said barrier layer prior to said first step.

7. The method of claim 1, wherein at least a portion of said first step includes inducing a first negative DC bias on a first pedestal electrode supporting said substrate and wherein at least a portion of said second step includes inducing on a second pedestal electrode a second negative DC bias of lesser magnitude than said first negative DC bias, wherein said second pedestal electrode may be said first pedestal electrode.

8. The method of claim 7, wherein said first negative DC bias has a magnitude of at least 50V and wherein said second negative DC bias has a magnitude of no more than 20V.

9. The method of claim 1, wherein said first step includes at least two cycles of alternately applying a low biasing voltage and a high biasing voltage higher than said low biasing voltage to a pedestal electrode supporting said substrate.

10. The method of claim 1, wherein said first step produces a V-shaped layer of copper within said hole having a cusp separated from a bottom of said hole.

11. The method of claim 10, wherein said cusp is located in an upper half of said hole.

12. The method of claim 1, further comprising supplying a diffusion enhancing gas into a plasma of said second step.

13. The method of claim 12, wherein said diffusion enhancing gas comprises hydrogen.

14. The method of claim 12, wherein said diffusion enhancing gas comprises helium.

15. A method of sputter filling copper into a hole formed in a dielectric layer in a substrate, comprising the steps of:
   a first step of depositing copper into said hole including holding a temperature of said substrate at a first temperature of less than 100° C. and biasing said substrate with a first bias voltage; and
   a subsequent second step of depositing copper into said hole and filling it including holding said temperature of said substrate at a second temperature greater than said first temperature and biasing said substrate with a second bias voltage less than said first bias voltage.

16. The method of claim 15, wherein said first step fills a bottom half of said hole.

17. The method of claim 16, further including exposing said substrate to hydrogen during said second step.

18. The method of claim 15, wherein said second temperature is in a range of 200° to 450° C.

19. A method of sputtering copper into a hole formed in a substrate, comprising the steps of:
   applying a voltage to a copper target to discharge a working gas within a plasma sputter reactor into a plasma, whereby copper is sputtered from said target onto a substrate in opposition to said target; and
   while sputtering said copper from said target onto said substrate, introducing through a gas supply port a diffusion promoting gas into said chamber selected from the group consisting of hydrogen and helium to create a plasma of said gas to thereby increase a diffusion of said copper in said hole.

20. The method of claim 19, wherein said diffusion promoting gas comprises helium.

21. The method of claim 19, wherein said diffusion promoting gas comprises hydrogen.

22. The method of claim 19, wherein said sputtering step fills said hole.

23. The method of claim 19, further comprising supplying through said gas supply port argon as said working gas.

24. The method of claim 19, further comprising maintaining a pedestal supporting said substrate at a temperature of at least 100° C. during at least a terminal portion of said sputtering step.

25. The method of claim 24, wherein said temperature is at least 200° C.

26. A method of sputtering copper into a hole formed in a substrate, comprising the steps:
   supporting said substrate on a pedestal electrode in a plasma sputter reactor;
   applying a negative DC voltage to a copper target in opposition to said pedestal electrode;
   discharging a sputter working gas into a plasma to thereby sputter copper from said copper target; and
   applying RF power through a high-pass coupling circuit to said pedestal electrode to produce a DC self-bias on said pedestal, wherein said applying step includes at least two cycles of applying alternating levels of said RF power to produce a low level of said DC self-bias and a high level of said DC self-bias.

27. The method of claim 26, wherein said low level of DC voltage is no more than 80V and said high level of DC voltage is greater than 100V.

28. The method of claim 26, wherein said low level of DC voltage is achieved by applying substantially no RF power to said pedestal electrode.

29. The method of claim 26, wherein said DC voltage and a temperature of said pedestal electrode are maintained substantially constant during said cycles.

30. The method of claim 26, wherein during periods of said low level of DC bias copper is deposited on a corner at a top of said hole and during periods of said high level of DC bias said corner is etched.

31. A method of filling a hole formed in a substrate with copper, comprising the steps of:
   a first step of sputtering copper into said hole while applying a negative DC bias of a first magnitude to said substrate; and
   a second step of sputtering copper into and filling said hole while during at least a portion of said second step of applying a negative DC bias of a second magnitude less than said first magnitude.

32. The method of claim 31, wherein said first step includes maintaining said substrate at a first temperature and wherein said second step includes maintaining said substrate at a second temperature higher than said first temperature.

33. The method of claim 32, wherein said first temperature is no more than 100° C. and said second temperature is at least 200° C.

34. The method of claim 31, further comprising during at least one of said first and second step introducing gaseous hydrogen into a reactor chamber containing said substrate and exciting it into a plasma.

* * * * *